(12) United States Patent
Sun et al.

(10) Patent No.: US 11,044,047 B2
(45) Date of Patent: Jun. 22, 2021

(54) METHOD AND APPARATUS FOR USING AT LEAST ONE REDUNDANCY VERSION FOR TRANSMISSION OF A DATA UNIT

(71) Applicant: NOKIA TECHNOLOGIES OY, Espoo (FI)

(72) Inventors: Jingyuan Sun, Beijing (CN); Dongyang Du, Hangzhou (CN); Wei Jiang, Hangzhou (CN); Xiangnian Zeng, Hangzhou (CN); Yi Zhang, Beijing (CN)

(73) Assignee: NOKIA TECHNOLOGIES OY, Espoo (FI)

( * ) Notice: Subject to any disclaimer, the term of this patent is extended or adjusted under 35 U.S.C. 154(b) by 0 days.

(21) Appl. No.: 16/637,789

(22) PCT Filed: Aug. 10, 2017

(86) PCT No.: PCT/CN2017/096911
§ 371 (c)(1),
(2) Date: Feb. 10, 2020

(87) PCT Pub. No.: WO2019/028774
PCT Pub. Date: Feb. 14, 2019

(65) Prior Publication Data
US 2020/0244395 A1    Jul. 30, 2020

(51) Int. Cl.
*H04L 1/00*     (2006.01)
*H03M 13/11*    (2006.01)
*H03M 13/25*    (2006.01)

(52) U.S. Cl.
CPC ....... *H04L 1/0057* (2013.01); *H03M 13/1102* (2013.01); *H03M 13/251* (2013.01);
(Continued)

(58) Field of Classification Search
None
See application file for complete search history.

(56) References Cited

U.S. PATENT DOCUMENTS

| 9,071,402 B2 | 6/2015 | Cheng |
| 2009/0037797 A1* | 2/2009 | Spencer ............ H03M 13/6362 714/790 |

(Continued)

FOREIGN PATENT DOCUMENTS

| CN | 101227259 A | 7/2008 |
| CN | 103312442 A | 9/2013 |

(Continued)

OTHER PUBLICATIONS

J. Xu and J. Xu, "A New Constellation Rearrangement without Signaling for IR-HARQ in the IMT-Advanced System," 2009 5th International Conference on Wireless Communications, Networking and Mobile Computing, Beijing, China, 2009, pp. 1-4, doi: 10.1109/WICOM.2009.5302144. (Year: 2009).*

(Continued)

*Primary Examiner* — Daniel F. McMahon
(74) *Attorney, Agent, or Firm* — Alston & Bird LLP

(57) ABSTRACT

A method comprises receiving information on a selected redundancy version at a user device. The redundancy version is associated with block coding. The block coding may be LDPC. The method may comprise using the information when communicating with a base station. The position of the redundancy version may satisfy one or more criteria.

17 Claims, 11 Drawing Sheets

---

| Is the RV separation between RV2 and RV3 larger than the separation between RV1 and RV2? | — 601 |

| Is the RV separation between RV1, RV2, or RV3 and the respective previous consecutive RV increased? | — 603 |

| Is the starting position of RV1, RV2, and/or RV3 outside the region of system bits? | — 605 |

| Is the RV separation between RV0 and RV1 larger than the separation between 1) RV1 and RV2, and 2) between RV2 and RV3? | — 607 |

(52) U.S. Cl.
CPC ........ *H03M 13/255* (2013.01); *H04L 1/0041* (2013.01); *H04L 1/0045* (2013.01)

(56) References Cited

U.S. PATENT DOCUMENTS

| | | | |
|---|---|---|---|
| 2009/0100309 A1* | 4/2009 | Zheng | H04L 1/0071 |
| | | | 714/748 |
| 2009/0125774 A1* | 5/2009 | Kim | H04L 1/189 |
| | | | 714/748 |
| 2010/0058136 A1 | 3/2010 | Lee et al. | |
| 2010/0309870 A1 | 12/2010 | Wengerter et al. | |
| 2015/0063280 A1 | 3/2015 | Nan et al. | |
| 2016/0173234 A1 | 6/2016 | Yamada et al. | |
| 2017/0201344 A1 | 7/2017 | Lim et al. | |
| 2018/0227077 A1* | 8/2018 | Lee | H03M 13/6306 |
| 2019/0356333 A1 | 11/2019 | Ma et al. | |
| 2020/0228254 A1* | 7/2020 | Ma | H04L 1/1896 |

FOREIGN PATENT DOCUMENTS

| | | |
|---|---|---|
| KR | 10 20090076785 A | 7/2009 |
| KR | 10 20100031575 A | 3/2010 |
| KR | 10 20100057918 A | 6/2010 |
| KR | 10 20150091444 A | 8/2015 |
| RU | 2473175 C2 | 1/2013 |
| WO | 2016-171356 A | 9/2016 |
| WO | WO 2017/107904 A1 | 6/2017 |
| WO | WO 2018/141240 A1 | 8/2018 |
| WO | WO 2018/144560 A1 | 8/2018 |

OTHER PUBLICATIONS

Decision to Grant and Search Report for Russian Application No. 2020107461/07 dated Jul. 29, 2020, 15 pages.
Notice of Allowance for Korean Application No. 10-2020-7006995 dated Sep. 23, 2020.
Huawei, HiSilicon "On rate matching for LDPC codes" [online], 3GPP TSGRAN WG1 Meeting #88 R1 / 1703365, 2017,[Retrieved from Internet] <URL:https://www.3gpp.org/ftp/TSG_RAN/WG1_RL1/TSGR1_88/Docs/R1 /1703365.zip>, dated Feb. 7, 2016.
Rate matching for LDPC[online], 3GPP TSG RAN WG1 NR Ad—Hoc #2 R 1—1711536, 2017, [Retrieved from Internet] <URL:https://www.3gpp.org/ftp/TSG_RAN/WG1_RL1/TSGR1_AH/NR_AH_1706/Docs/R1 / 1711536.zip>, dated Jun. 19, 2016.
Office Action for Japanese Patent Application No. 2020-529785 dated Nov. 13, 2020.
Office Action and Search Report for Russian Patent Application No. 2020130499/07(055202) dated Dec. 8, 2020, with English translation, 9 pages.
Rate Matching for eMBB, R1-1708828, 3GPP TSG RAN WG1 Meeting #89, Nokia, Alcatel-Lucent Shanghai Bell (May 2017) 6 pages.
Rate Matching for NR LDPC Codes, R1-1710485, 3GPP TSG RAN WG1 NR Ad-Hoc#2, Ericsson (Jun. 2017) 7 pages.
International Search Report and Written Opinion for Application No. PCT/CN2017/096911 dated Apr. 26, 2018, 7 pages.
Extended European Search Report for European Application No. 17920750.1 dated Feb. 18, 2021, 8 pages.
LG Electronics, "An RV Definition Scheme with Variable Starting Positions", 3GPP Draft; R1-072865, 3rd Generation Partnership Project (3GPP), TSG RAN WG1 Meeting #49bis (Jun. 21, 2007), 5 pages.
Huawei et al., "Rate Matching for LDPC Codes", 3GPP Draft; R1-1711438, 3rd Generation Partnership Project (3GPP) TSG RAN WG1 NR Ad-Hoc#2 (Jun. 27, 2017), 6 pages.
Nokia, "Rate Matching for LDPC", 3GPP Draft; R1-1711536, 3rd Generation Partnership Project (3GPP) TSG RAN WG1 NR Ad-Hoc #2 (Jun. 27, 2017), 5 pages.

* cited by examiner

METHOD AND APPARATUS FOR USING AT LEAST ONE REDUNDANCY VERSION FOR TRANSMISSION OF A DATA UNIT

CROSS-REFERENCE TO RELATED APPLICATIONS

This application is a national phase entry of International Application No. PCT/CN2017/096911, filed Aug. 10, 2017, the entire contents of which are incorporated herein by reference.

FIELD

This disclosure relates to a method and apparatus, and in particular but not exclusively to a method and apparatus which makes use of block coding, for example low density parity check coding.

BACKGROUND

A communication system can be seen as a facility that enables communication between two or more devices such as user terminals, machine-like terminals, base stations and/or other nodes by providing carriers between the communication devices. A communication system can be provided for example by means of a communication network and one or more compatible communication devices. The communication may comprise, for example, communication of data for carrying communications such as voice, electronic mail (email), text message, multimedia and/or content data and so on. Non-limiting examples of services provided include two-way or multi-way calls, data communication or multimedia services and access to a data network system, such as the Internet.

In a wireless system at least a part of communications between at least two stations occurs over wireless interfaces. Examples of wireless systems include public land mobile networks (PLMN), satellite based communication systems and different wireless local networks, for example wireless local area networks (WLAN). A local area wireless networking technology allowing devices to connect to a data network is known by the tradename Wi-Fi. Wi-Fi is often used synonymously with WLAN.

The wireless systems can be divided into cells, and are therefore often referred to as cellular systems. A user can access a communication system by means of an appropriate communication device or terminal. A communication device of a user is often referred to as user equipment (UE). A communication device is provided with an appropriate signal receiving and transmitting apparatus for enabling communications, for example enabling access to a communication network or communications directly with other users. The communication device may access a carrier provided by a station, for example a base station of a cell, and transmit and/or receive communications on the carrier.

The communication system and associated devices typically operate in accordance with a given standard or specification which sets out what the various entities associated with the system are permitted to do and how that should be achieved. Communication protocols and/or parameters which shall be used for the connection are also typically defined. Examples of standardised radio access technologies include GSM (Global System for Mobile), EDGE (Enhanced Data for GSM Evolution) Radio Access Networks (GERAN), Universal Terrestrial Radio Access Networks (UTRAN) and evolved UTRAN (E-UTRAN). An example of standardized communication system architectures is the long-term evolution (LTE) of the Universal Mobile Telecommunications System (UMTS) radio-access technology. The LTE is being standardized by the 3rd Generation Partnership Project (3GPP). The LTE employs the Evolved Universal Terrestrial Radio Access Network (E-UTRAN) access. Further developments of LTE are sometimes referred to as LTE Advanced (LTE-A).

SUMMARY

According to an aspect, there is provided a method comprising: using one or more of a set of redundancy versions, wherein positions of said redundancy versions in a buffer used in block coding satisfy one or more of the following criteria: a separation provided between a starting position of a third redundancy version RV2 and a starting position of a fourth redundancy version RV3 is larger than the separation between a starting position of a second redundancy version RV1 and a starting position of the third redundancy version RV2; a separation provided between the starting position of the second RV1, the starting position of third RV2, or the starting position of fourth redundancy version RV3 and the starting position of a respective previous consecutive redundancy version is increased; a starting position of the second redundancy version RV1, third redundancy version RV2, and/or fourth redundancy version RV3 is outside a region of system bits of said buffer; and a separation between the starting position of the first redundancy version RV0 and the starting position of second redundancy version RV1 is larger than a separation between the starting position of the second redundancy version RV1 and the starting position of a third redundancy version RV2, and a separation between the starting position of the third redundancy version RV2 and the starting position of a fourth redundancy version RV3.

The method may comprise determining a starting position of encoded bits from a buffer according to a respective one of said redundancy versions.

The method may comprise one of receiving and causing transmission of the encoded bits according to the respective one of said redundancy versions.

The respective starting position of the redundancy versions in the redundancy version set may be fixed.

The redundancy version set may have four redundancy versions.

The buffer may be a circular buffer.

The method may comprise receiving redundancy version index information and in dependence on said redundancy version index information, using the respective redundancy version.

The method may comprise receiving configuration information to define a criteria which the respective redundancy versions satisfy.

The buffer may comprise a first region comprising system bits to be transmitted and a second region comprising parity bits to be transmitted.

The first, second, and third redundancy versions may be provided in said first region.

The fourth redundancy version may be provided in the second region.

The second, third and fourth redundancy versions may be provided in said second region.

The first redundancy version may be provided in the first region.

The fixed redundancy positions may be selected based on a starting position of at least a second transmission.

This may be by assuming sequential transmission.

The method may be carried out in an apparatus of a user device.

The method may be carried out in an apparatus of a base station.

According to another aspect, there is provided a method comprising: using one or more of a set of redundancy versions, wherein positions of said redundancy versions in a buffer used in block coding satisfy the following criteria: a separation provided between a starting position of a third redundancy version RV2 and a starting position of a fourth redundancy version RV3 is larger than the separation between a starting position of a second redundancy version RV1 and a starting position of the third redundancy version RV2.

According to another aspect, there is provided a method comprising: using one or more of a set of redundancy versions, wherein positions of said redundancy versions in a buffer used in block coding satisfy the following criteria: a separation provided between the starting position of the second RV1, the starting position of third RV2, or the starting position of fourth redundancy version RV3 and the starting position of a respective previous consecutive redundancy version is increased.

According to another aspect, there is provided a method comprising: using one or more of a set of redundancy versions, wherein positions of said redundancy versions in a buffer used in block coding satisfy the following criteria: a starting position of the second redundancy version RV1, third redundancy version RV2, and/or fourth redundancy version RV3 is outside a region of system bits of said buffer.

According to an aspect, there is provided a method comprising: using one or more of a set of redundancy versions, wherein positions of said redundancy versions in a buffer used in said block coding satisfy the following criteria: a separation between the starting position of the first redundancy version RV0 and the starting position of second redundancy version RV1 is larger than a separation between the starting position of the second redundancy version RV1 and the starting position of a third redundancy version RV2, and a separation between the starting position of the third redundancy version RV2 and the starting position of a fourth redundancy version RV3.

According to an aspect, there is provided a method using one or more of a set of redundancy versions, wherein positions of said redundancy versions in a buffer used in said block coding are such that a majority of said redundancy version positions are in one of a region of the buffer having system bits to be transmitted.

According to an aspect, there is provided a method using one or more of a set of redundancy versions, wherein positions of said redundancy versions in a buffer used in said block coding are such that a majority of said redundancy version positions are in one of a region of the buffer having parity bits to be transmitted.

According to an aspect, there is provided a method, comprising selecting at a base station a redundancy version based on an end position of a last transmission for an information block; and providing information on said selected redundancy version to a user device.

The information may comprise an index.

According to an aspect, there is provided a method comprising: receiving information on a selected redundancy version at a user device, said redundancy version being associated with block coding; and using said information when communicating with a base station.

According to another aspect, there is provided an apparatus, said apparatus comprising at least one processor, and at least one memory including computer program code, wherein the at least one memory and the computer program code are configured, with the at least one processor, to: use one or more of a set of redundancy versions, wherein positions of said redundancy versions in a buffer used in block coding satisfy one or more of the following criteria: a separation provided between a starting position of a third redundancy version RV2 and a starting position of a fourth redundancy version RV3 is larger than the separation between a starting position of a second redundancy version RV1 and a starting position of the third redundancy version RV2; a separation provided between the starting position of the second RV1, the starting position of third RV2, or the starting position of fourth redundancy version RV3 and the starting position of a respective previous consecutive redundancy version is increased; a starting position of the second redundancy version RV1, third redundancy version RV2, and/or fourth redundancy version RV3 is outside a region of system bits of said buffer; and a separation between the starting position of the first redundancy version RV0 and the starting position of second redundancy version RV1 is larger than a separation between the starting position of the second redundancy version RV1 and the starting position of a third redundancy version RV2, and a separation between the starting position of the third redundancy version RV2 and the starting position of a fourth redundancy version RV3.

The at least one memory and the computer code may be configured with the at least one processor to determine a starting position of encoded bits from a buffer according to a respective one of said redundancy versions.

The at least one memory and the computer code may be configured with the at least one processor to one of receive and cause transmission of the encoded bits according to the respective one of said redundancy versions.

The apparatus may be provided in a base station.

The apparatus may be provided in a user device.

The respective starting position of the redundancy versions in the redundancy version set may be fixed.

The redundancy version set may have four redundancy versions.

The buffer may be a circular buffer.

The at least one memory and the computer code may be configured with the at least one processor to receive redundancy version index information and in dependence on said redundancy version index information, using the respective redundancy version.

The at least one memory and the computer code may be configured with the at least one processor to receive configuration information to define a criteria which the respective redundancy versions satisfy.

The buffer may comprise a first region comprising system bits to be transmitted and a second region comprising parity bits to be transmitted.

The first, second, and third redundancy versions may be provided in said first region.

The fourth redundancy version may be provided in the second region.

The second, third and fourth redundancy versions may be provided in said second region.

The first redundancy version may be provided in the first region.

The fixed redundancy positions may be selected based on a starting position of at least a second transmission.

This may be by assuming sequential transmission.

According to another aspect, there is provided an apparatus, said apparatus comprising at least one processor, and at least one memory including computer program code, wherein the at least one memory and the computer program code are configured, with the at least one processor, to: use one or more of a set of redundancy versions, wherein positions of said redundancy versions in a buffer used in block coding satisfy the following criteria: a separation provided between a starting position of a third redundancy version RV2 and a starting position of a fourth redundancy version RV3 is larger than the separation between a starting position of a second redundancy version RV1 and a starting position of the third redundancy version RV2.

According to another aspect, there is provided an apparatus, said apparatus comprising at least one processor, and at least one memory including computer program code, wherein the at least one memory and the computer program code are configured, with the at least one processor, to: use one or more of a set of redundancy versions, wherein positions of said redundancy versions in a buffer used in block coding satisfy the following criteria: a separation provided between the starting position of the second RV1, the starting position of third RV2, or the starting position of fourth redundancy version RV3 and the starting position of a respective previous consecutive redundancy version is increased.

According to another aspect, there is provided an apparatus, said apparatus comprising at least one processor, and at least one memory including computer program code, wherein the at least one memory and the computer program code are configured, with the at least one processor, to: use one or more of a set of redundancy versions, wherein positions of said redundancy versions in a buffer used in block coding satisfy the following criteria: a starting position of the second redundancy version RV1, third redundancy version RV2, and/or fourth redundancy version RV3 is outside a region of system bits of said buffer.

According to another aspect, there is provided an apparatus, said apparatus comprising at least one processor, and at least one memory including computer program code, wherein the at least one memory and the computer program code are configured, with the at least one processor, to: use one or more of a set of redundancy versions, wherein positions of said redundancy versions in a buffer used in said block coding satisfy the following criteria: a separation between the starting position of the first redundancy version RV0 and the starting position of second redundancy version RV1 is larger than a separation between the starting position of the second redundancy version RV1 and the starting position of a third redundancy version RV2, and a separation between the starting position of the third redundancy version RV2 and the starting position of a fourth redundancy version RV3.

According to another aspect, there is provided an apparatus, said apparatus comprising at least one processor, and at least one memory including computer program code, wherein the at least one memory and the computer program code are configured, with the at least one processor, to: use one or more of a set of redundancy versions, wherein positions of said redundancy versions in a buffer used in said block coding are such that a majority of said redundancy version positions are in one of a region of the buffer having system bits to be transmitted.

According to another aspect, there is provided an apparatus, said apparatus comprising at least one processor, and at least one memory including computer program code, wherein the at least one memory and the computer program code are configured, with the at least one processor, to: use one or more of a set of redundancy versions, wherein positions of said redundancy versions in a buffer used in said block coding are such that a majority of said redundancy version positions are in one of a region of the buffer having parity bits to be transmitted.

According to another aspect, there is provided an apparatus, said apparatus comprising at least one processor, and at least one memory including computer program code, wherein the at least one memory and the computer program code are configured, with the at least one processor, to: select at a base station a redundancy version based on an end position of a last transmission for an information block; and provide information on said selected redundancy version to a user device.

The information may comprise an index.

According to another aspect, there is provided an apparatus, said apparatus comprising at least one processor, and at least one memory including computer program code, wherein the at least one memory and the computer program code are configured, with the at least one processor, to: receive information on a selected redundancy version at a user device, said redundancy version being associated with block coding; and using said information when communicating with a base station.

A device and/or a communication system comprising an apparatus configured to provide at least one of the embodiments can also be provided. The device may comprise a communication device such as a user equipment or another node capable of wireless communication, or a network node.

A computer program comprising program code means adapted to perform the herein described methods may also be provided. In accordance with further embodiments apparatus and/or computer program product that can be embodied on a computer readable medium for providing at least one of the above methods is provided.

Various other aspects and further embodiments are also described in the following detailed description of examples embodying the invention and in the attached claims.

BRIEF DESCRIPTION OF FIGURES

Some embodiments will now be described in further detail, by way of example only, with reference to the following examples and accompanying drawings, in which.

DETAILED DESCRIPTION OF EMBODIMENTS

Before explaining in detail the examples, certain general principles of a wireless communication system and mobile communication devices are briefly explained with reference to FIGS. 1 to 2 to assist in understanding the technology underlying the described examples.

Figure 1:
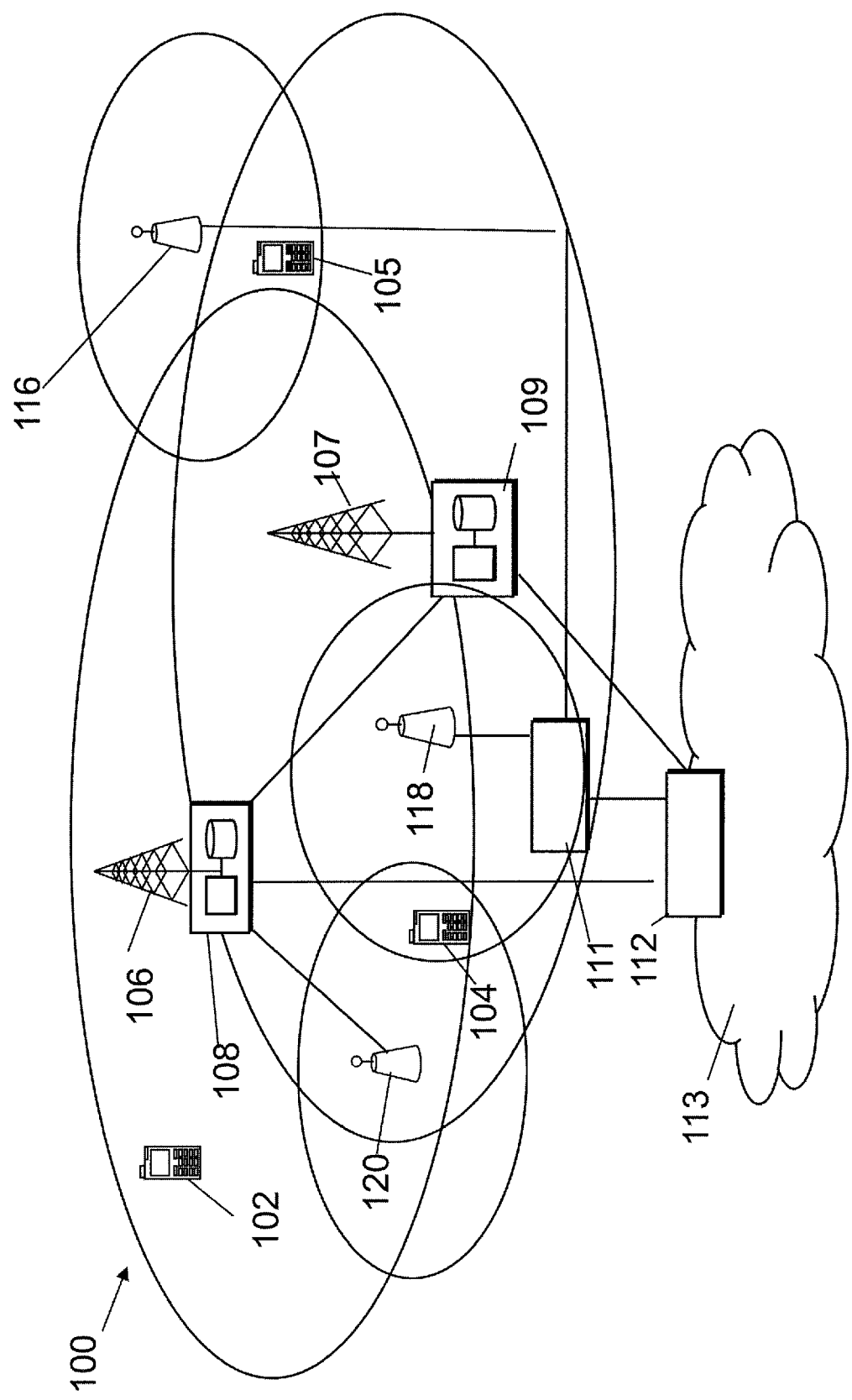
FIG. 1 shows a schematic example of a system where the invention may be implemented.

In a wireless communication system 100, such as that shown in FIG. 1, mobile communication devices or user equipment (UE) 102, 104, 105 are provided wireless access via at least one base station or similar wireless transmitting and/or receiving node or point. Base stations are typically controlled by at least one appropriate controller apparatus, so as to enable operation thereof and management of mobile communication devices in communication with the base stations. The controller apparatus may be located in a radio access network (e.g. wireless communication system 100) or in a core network (CN) (not shown) and may be implemented as one central apparatus or its functionality may be distributed over several apparatuses. The controller apparatus may be part of the base station and/or provided by a separate entity such as a Radio Network Controller (RNC). In FIG. 1 control apparatus 108 and 109 are shown to control the respective macro level base stations 106 and 107. The control apparatus of a base station can be interconnected with other control entities. The control apparatus is typically provided with memory capacity and at least one data processor. The control apparatus and functions may be distributed between a plurality of control units. In some systems, the control apparatus may additionally or alternatively be provided in a radio network controller.

Figure 2:
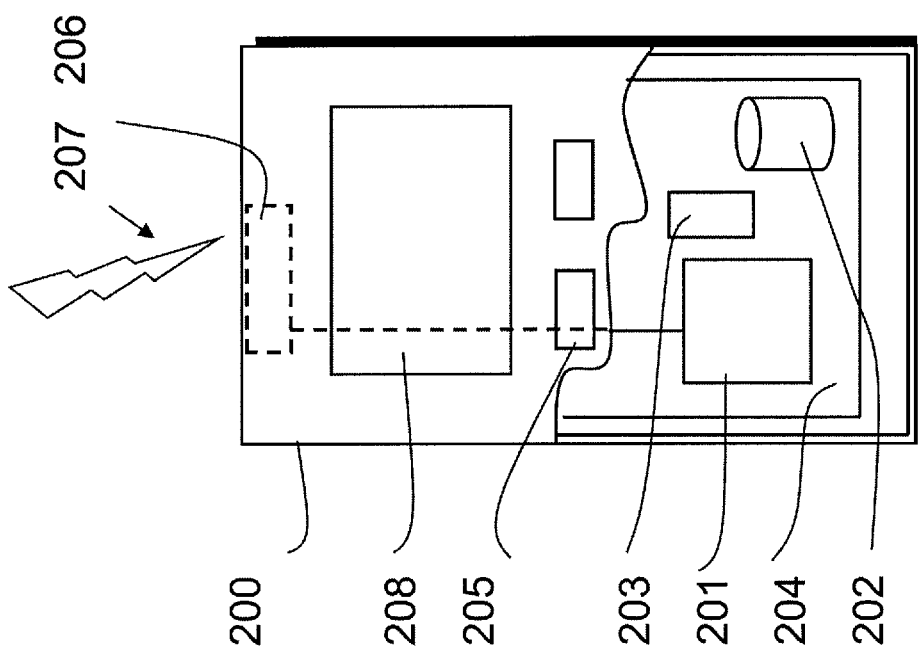
FIG. 2 shows an example of a communication device.

A possible mobile communication device will now be described in more detail with reference to FIG. 2 showing a schematic, partially sectioned view of a communication device 200. Such a communication device is often referred to as user equipment (UE) or terminal. An appropriate mobile communication device may be provided by any device capable of sending and receiving radio signals. Non-limiting examples comprise a mobile station (MS) or mobile device such as a mobile phone or what is known as a 'smart phone', a computer provided with a wireless interface card or other wireless interface facility (e.g., USB dongle), personal data assistant (PDA) or a tablet provided with wireless communication capabilities, or any combinations of these or the like. A mobile communication device may provide, for example, communication of data for carrying communications such as voice, video, electronic mail (email), text message, multimedia and so on. Users may thus be offered and provided numerous services via their communication devices and there may be one or more applications running in the MS requiring data transmission between the MS and the network. Non-limiting examples of these services comprise two-way or multi-way calls, data communication or multimedia services or simply an access to a data communications network system, such as the Internet. Users may also be provided broadcast or multicast data. Non-limiting examples of the content comprise downloads, television and radio programs, videos, advertisements, gaming, various alerts and other information.

The mobile device 200 may receive signals over an air or radio interface 207 via appropriate apparatus for receiving and may transmit signals via appropriate apparatus for transmitting radio signals. In FIG. 2 transceiver apparatus is designated schematically by block 206. The transceiver apparatus 206 may be provided for example by means of a radio part and associated antenna arrangement. The antenna arrangement may be arranged internally or externally to the mobile device.

A mobile device is typically provided with at least one data processing entity 201, at least one memory 202 and other possible components 203 for use in software and hardware aided execution of tasks it is designed to perform, including control of access to and communications with access systems and other communication devices. The data processing, storage and other relevant control apparatus can be provided on an appropriate circuit board and/or in chipsets. This feature is denoted by reference 204. The user may control the operation of the mobile device by means of a suitable user interface such as key pad 205, voice commands, touch sensitive screen or pad, combinations thereof or the like. A display 208, a speaker and a microphone can be also provided. Furthermore, a mobile communication device may comprise appropriate connectors (either wired or wireless) to other devices and/or for connecting external accessories, for example hands-free equipment, thereto.

The communication devices 102, 104, 105 may access the communication system based on various access techniques, such as code division multiple access (CDMA), or wideband CDMA (WCDMA). Other non-limiting examples comprise time division multiple access (TDMA), frequency division multiple access (FDMA) and various schemes thereof such as the interleaved frequency division multiple access (IF-DMA), single carrier frequency division multiple access (SC-FDMA) and orthogonal frequency division multiple access (OFDMA), space division multiple access (SDMA) and so on. Further non-limiting examples comprise those based on the third Generation Partnership Project (3GPP) specifications. Some embodiments may be provided in the LTE-Advanced Pro system, which will be part of 3GPP LTE Rel-15. Of course, other embodiments may be provided in the context of other standards. A base station is referred to as an eNodeB in the context of LTE and gNodeB in the context of 5G.

Figure 7:
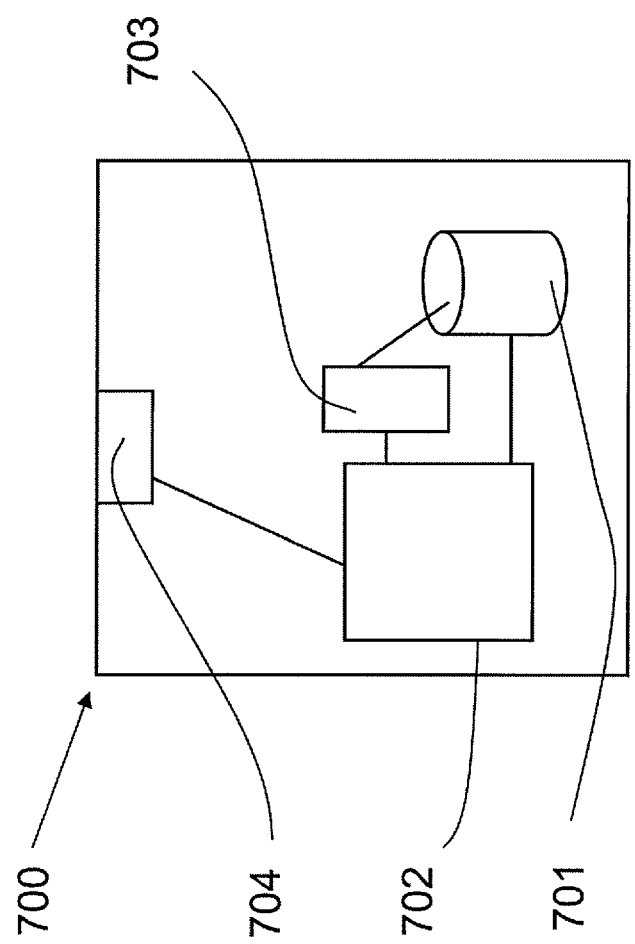
FIG. 7 shows an example of an apparatus.

FIG. 7 shows an example of an apparatus 700 provided in or associated with a base station, as shown in FIG. 1. The apparatus comprises at least one memory 701, at least one data processing unit or at least one data processor 702, 703 and an input/output interface 704. Via the interface the apparatus can be coupled to a receiver and a transmitter of the base station.

Hybrid Automatic Repeat Request (HARQ) techniques may be used to provide reliability requirements in wireless communication systems.

Existing wireless standards (e.g., LTE, etc. . . . ) use HARQ by sending feedback per each transmit block (TB) received at the receiver. In the context of LTE, ACK/NACK feedback is sent per transmit/transport block (TB) and 1 to 2 bits are used to indicate whether the received TB(s) is in error or not. The ACK/NACK feedback bits are transmitted with uplink control information (UCI) for format 1a/1b. In the case of carrier aggregation, more feedback bits are used in ACK/NACK for multiple carriers and transmitted on the primary component carrier (PCC). In particular, ACK/NACK may use UCI format 3 or format 1b with channel selection.

In LTE, the definition of redundancy versions (RVs) provide freedom for the selection of bits for retransmission and may not increase the decoding complexity. In LTE, 4 RVs may be defined, wherein the 4 RVs (0, 1, 2, 3) may be spaced uniformly in a turbo mother code rate as 1/3, where the $RV_0$ is started from the first system bit that is not punctured.

In a 5G system, high data rate transmissions are expected. Large bandwidth and efficient transmission schemes may be used in 5G systems, resulting in a significant increase in data rates, especially for the enhanced mobile broadband (eMBB) scenario. The high data rate requirement of 5G may increase the size of the TB. Thus, the size of transmit block will become larger for longer packet transmissions. Low density parity check (LDPC) may be used for channel coding due to its good performance and low implementation complexity. For example, LDPC may be used to support the eMBB scenario in 5G systems. LDPC has implicit error detection ability and CB (code block) errors in LDPC may be implicitly detected without Cycling Redundancy Check (CRC). Thus, a LDPC coding scheme may support finer ACK/NACK feedback.

For low-density parity-check (LDPC) in new radio (NR) the RV definition may be different from that defined in Turbo LTE. Turbo code is convolutional code and decoding is always at a rate of 1/3, where a different parity bit contributes similarly to performance and decoding complexity.

In LDPC, parity-check matrices (PCMs) are different for different rates. For example, the PCM for lower rates may typically be an extended version of the PCM at a higher rate. The decoding complexity and latency for a higher code rate PCM will be lower than the complexity and latency for a lower code rate PCM.

Accordingly, when parity bits corresponding to a lower or a higher code rate PCM part is used, the PCM for a lower or a higher code rate should be used respectively for decoding it, as they have different decoding complexities. Additionally, the parity bits corresponding to a higher code rate PCM would generally provide more support and more gain for error correction than the parity bits corresponding to the lower code rate PCM.

In the context of rate match for eMBB, it has been proposed the built-in puncturing of systematic bits is supported for LDPC coding. For example, for the initial transmission at least, the coded bits may be taken after skipping the first systematic bits ($N_{sys,punct}$), where $N_{sys,punct}$ is selected from: 0, Z, and 2*Z. Z is the lifting size for quasi-cyclic LDPC codes.

The rate matching for LDPC code is based on a circular buffer. This may be similar to the concept utilized in LTE. The circular buffer may be filled with an ordered sequence of systematic bits and parity bits.

For incremental redundancy HARQ (IR-HARQ), each RV ($RV_i$) may be assigned a starting bit location $S_i$ on the circular buffer.

For incremental redundancy (IR) retransmission of $RV_i$, the coded bits are read out sequentially from the circular buffer, starting with the bit location $S_i$. A transmitter may transmit different redundancy versions (RVs) of a packet/protocol data unit that may include the same information bits but different parity bits (or a different number of parity bits). In incremental redundancy, each redundancy version contains different information: different set of coded bits generated from the original data bits. Each different set is referred as a redundancy version (RV), such as RV0, RV1, RV2, RV3.

Each transmission may start from a starting position of one RV selected from a set of RVs. The different redundancy versions of a protocol data unit may be referred to as redundancy version 0 (RV0), RV1, RV2, RV3, etc. For example, an initial transmission of a protocol data unit or transport block (TB) may be transmitted from a starting position of redundancy version 0 (RV0), while a subsequent retransmission of the protocol data unit or the TB may be transmitted from a starting position of a different RV, e.g., RV1, RV2, RV3, according to an example implementation, where each redundancy version contains a different set of coded bits. A transport block (TB) may include an encoded protocol data unit, including both information bits and parity bits. For example, a MAC PDU (media access control protocol data unit) may be encoded (including both information bits and parity bits) as a transport block (TB), and may be sent as RV0 of the PDU. A different redundancy version (e.g., RV1, RV2, RV3) of the PDU may be sent as a retransmission.

Limited buffer rate matching (LBRM) may be supported.

It has been proposed that the number of RVs always be 4. In other embodiments, a different number of RVs may be provided.

It has been proposed that the RVs are at fixed locations in the circular buffer. In other embodiments, the locations may be varied dependent on one or more factors. For example, the locations may be dependent on channel conditions.

In some embodiments, the fixed locations are the same for all code rates. However, in other embodiments, the fixed locations may be dependent on the code rate. In other embodiments, the fixed locations may be dependent on a set of code rates.

It has been proposed that RV #0 is self-decodable.

It has been proposed that the first 2Z punctured systematic bits are not entered into the circular buffer. In other embodiments, some or all of the 2Z punctured bits may be entered into the circular buffer.

The support of sequential transmission (sequential transmission means each retransmission starts from the end of the last transmission) in the definition of RV may be advantageous, for example for a better performance. Sequential transmission may provide better performance than LTE-like uniformly spaced and fixed RVs. Sequential transmission may be supported in the definition of RVs considering the different contribution of encoded parity bits in LDPC for complexity and performance. However, this may create issues, as it may create a mismatch between the UE and the eNB in the understanding of the starting positions of retransmission for sequential transmission.

It has been proposed that 5G LDPC utilize four fixed RV positions.

When 4 fixed RV positions are used, in LTE RV the positions may be pre-determined, and the RV positions may be uniformly spaced in the encoded block for the supported lowest code rate.

Figure 3:
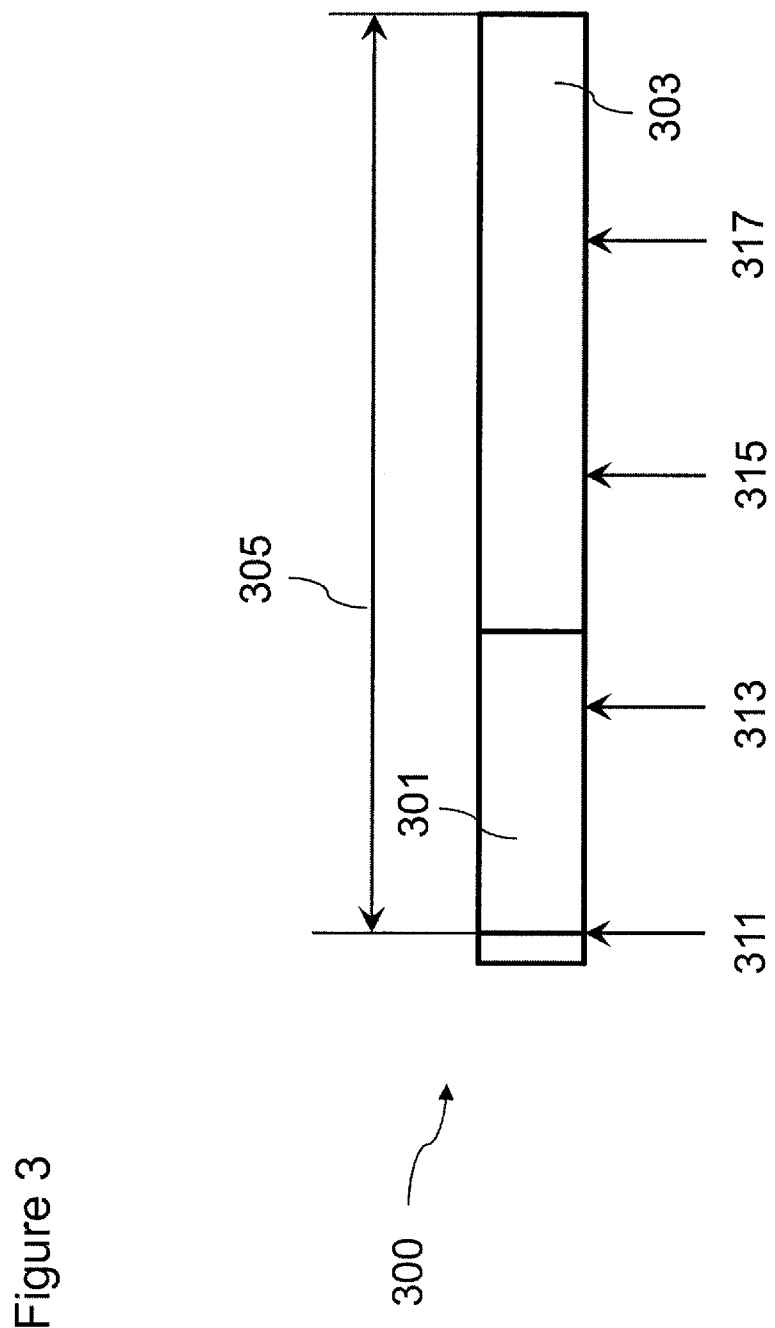
FIG. 3 shows an example of a circular buffer in LTE.

For example, FIG. 3 shows one cycle of a circular buffer 305 which is filled with system bits to be transmitted 301 followed by parity bits 303. The bits in the circular buffer are specified by different redundancy versions (RVs), i.e., RV0 311, RV1 313, RV2 315, and RV3 317, which are uniformly spaced with starting point of RV0 311 and RV1 313 are in the system bits 301, and starting point of RV2 315 and RV3 317 are in the parity bits 303.

When 4 fixed RV positions are used in LDPC, for large code block sizes, the supported lowest code rate may be 1/3. Considering the PCM, the starting position of RVs for large block size cases may be 2*z, 18.5*z, 35*z, 51.5*z, where z is the lifting size and the PCM for code rate 1/3 is a matrix of size 46*68. The first 2z punctured systematic bits may not be entered into the circular buffer.

The fixed position of the RVs needs to be determined in order to provide good performance. For example, the starting positions of RV1, RV2 and RV3 needs to be determined.

Some embodiments provide a method and apparatus for determining the position of RVs in fixed positions using one or more of the following properties:

The separation between starting point of RV2 and RV3 is larger than the separation between starting point of RV1 and RV2;

The separation between starting point of RV1, RV2, and RV3 to the respective starting point of previous RV gradually increases (i.e. the separation of RV3→RV2>RV2→RV1>RV1→RV0);

The starting position for starting point of RV1, RV2, and/or RV3 is outside the region of system bits 301; and The separation between starting point of RV0 and RV1 is larger than the separation 1) between starting point of RV1 and RV2, and 2) between starting point of RV2 and RV3.

Generally retransmissions may utilize the same size of resource and the same modulation order as that for a first transmission. Although the real size of resource for retransmission may be larger or smaller than that for the first transmission, the average size of the resource for retransmission may be similar to that for the first transmission, as it is likely that the channel status may not have a large change in the short time between the first transmission and retransmission.

In some embodiments, the PCM for lowest code rate may be a matrix with size 46*68, where the first 2Z punctured systematic bits may not be entered into the circular buffer. Of course, in other embodiments, a different size of matrix may be used, and/or the first 2Z punctured systematic bits may be entered into the circular buffer. In some embodiments there may be no puncturing of systematic bits.

For LDPC codes, the parity bits generated by higher weight rows in PCM and the parity bits generated by lower weight rows in PCM may have different priority. The higher the row weight that the parity bits correspond to, the higher priority that the parity bits may have, as the performance gain provided by those parity bits may be higher.

In order to provide a higher chance for selection of the high priority parity bits into the retransmission, there may be provided a gradual reduction in RV separation in-between the 4 fixed RV starting positions.

In a first embodiment, for a block code (e.g. LDPC) with fixed RV starting positions. An RV with a starting position closer to the starting position of a circular buffer, may have a shorter separation to the starting position of the next RV, for example, the separation of the starting positions of RV0 and RV1 may determine the subsequent separation between the starting positions of RV1 and RV2. Hence, less separation between the starting positions of RV0 and RV1, creates less separation between the starting positions of RV1 and RV2. For example, in FIG. 4, the starting position of RV0 311 is on the boundary of the system bits to be transmitted region, the starting position of RV1 413 is within the system bits to be transmitted region 301, and the starting position of RV2 415 may be on the boundary of the system bits to be transmitted region 301 and the parity bit region 303. These densely packed RVs may provide a higher chance to retransmit from a bit that may have a higher priority. Such a definition may provide a similar effect as a dense RV for high-priority bits range. The starting position of RV3 417 is within the parity bit region 303.

Figure 4:
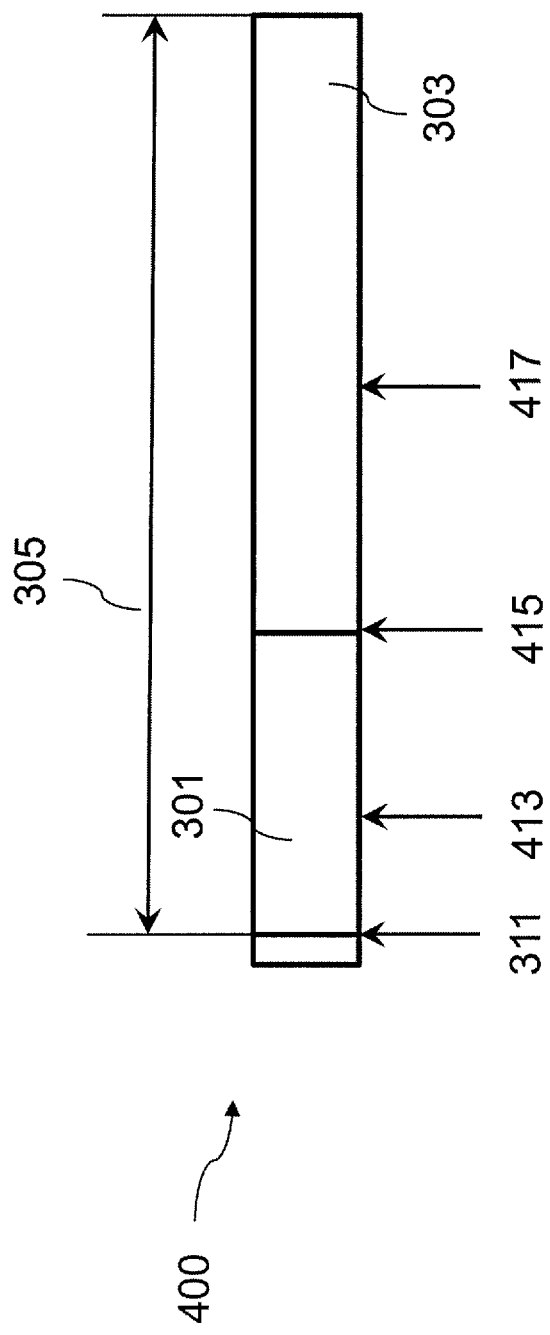
FIG. 4 shows an example first embodiment of a circular buffer in LTE.

As shown in FIG. 4, the separation between the starting position of RVs may gradually increase, such that the separation between the starting positions of RV3 417 and RV2 415 may be greater than the separation between the starting positions of RV2 415 and RV1 413 which may in turn be greater than the separation between the starting positions of RV1 413 and RV0 311 (i.e. RV3→RV2>RV2→RV1>RV1→RV0). Such a definition of the RVs may provide a similar effect as a dense RV for high-priority bits range in the whole encoded codes.

Figure 5:
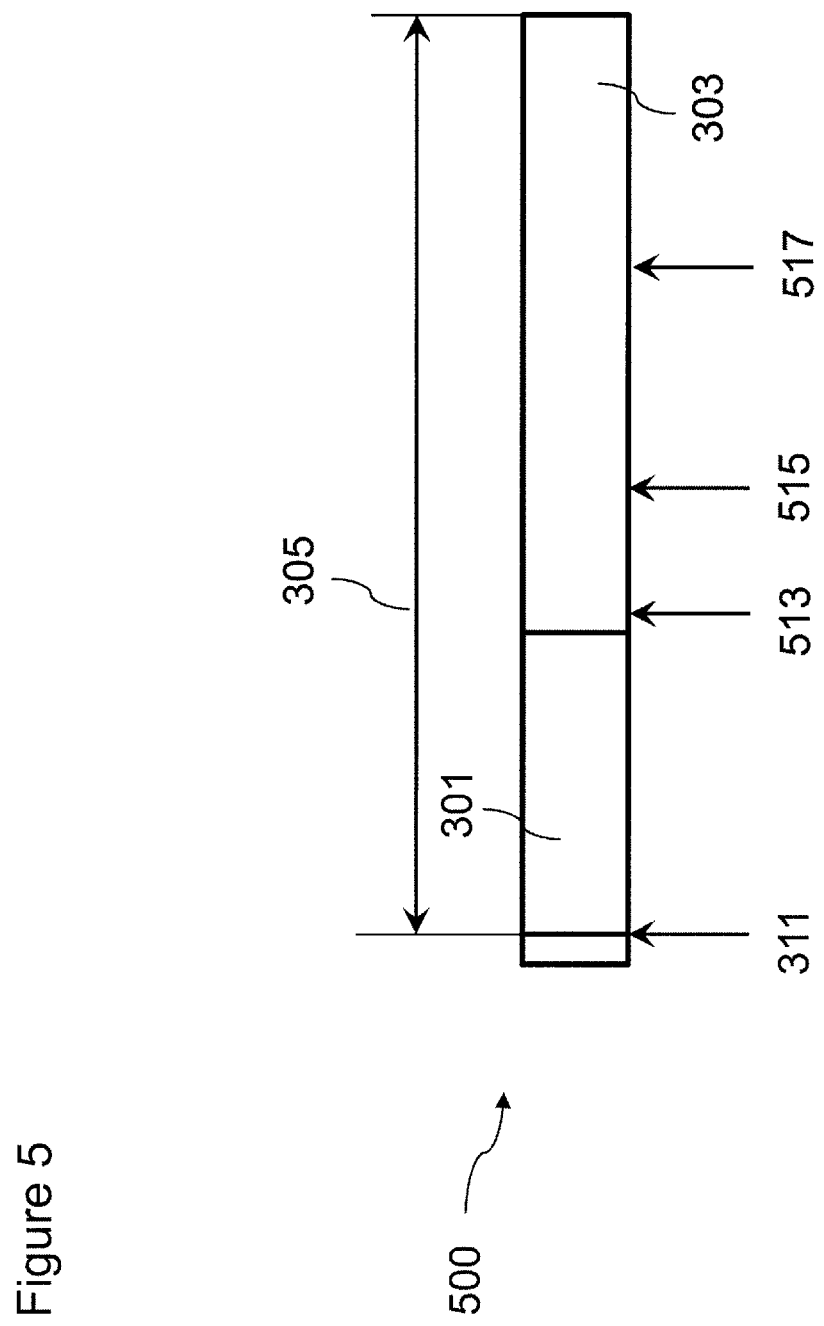
FIG. 5 shows an example second embodiment of a circular buffer in LTE.

Reference is now made to FIG. 5 which shows a second embodiment of the block code (e.g. LDPC) circular buffer (305). In the second embodiment starting position of all the RVs 513, 515, 517, except for RV0 311 may be in the parity bits region 303 of the circular buffer 305. The separation between the starting position of RV1 513, RV2 515, and RV3 517 may gradually increase (i.e. RV3→RV2>RV2→RV1). However, the starting position of RV0 may have the greatest separation relative to the starting position of RV1 as it is at the beginning of the system bits to be transmitted region 301. Thus the increasing separation distance of RVs may only be within the set {RV1, RV2, RV3}. This definition of RVs may provide a similar effect as the dense RV for high-priority bits range in the parity bits region 303.

Additionally, it can be seen that, in this example, a separation between the starting position of the first redundancy version RV0 and the starting position of second redundancy version RV1 is larger than a separation between the starting position of the second redundancy version RV1 and the starting position of a third redundancy version RV2, and a separation between the starting position of the third redundancy version RV2 and the starting position of a fourth redundancy version RV3.

Furtherly, it can be seen that starting positions of the second redundancy version RV1, third redundancy version RV2, and/or fourth redundancy version RV3 are outside a region of system bits in this example.

In a system, when HARQ is used, the scheduler may guarantee that the success ratio of the first transmission (initial transmission) may be approximately 90% (in some cases this may be slightly lower). The success ratio of second transmission (first retransmission) may subsequently achieve a success ratio of approximately 99%. The success ratio of subsequent third and/or fourth transmissions may then achieve success ratios of which are approximately 100%. Therefore, the first transmission has the highest importance, the second transmission will have the second highest importance, and subsequently the third, and fourth transmissions have lower importance still. The starting position of first transmission may always be from RV0 311, i.e. the first bit to be transmitted. It is advantageous to design the starting position of RV1, RV2 and RV3 according to the relative importance of the retransmissions.

In some embodiments, the fixed RV positions are selected based on the starting position of the second transmission (starting position of RV1) for all possible different code rates, when the same resource size for each transmission of the information block is used.

Figure 6:
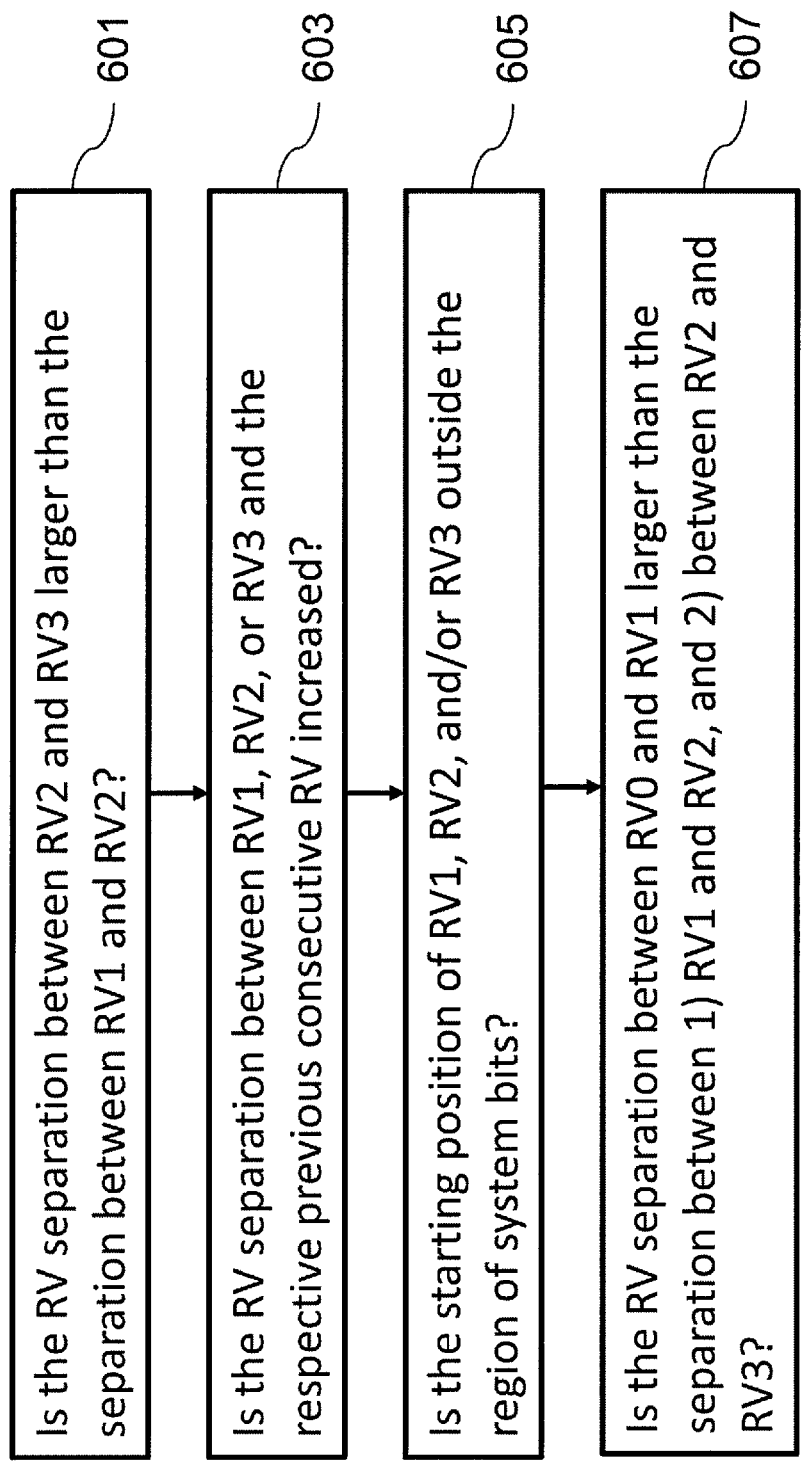
FIG. 6 shows a method for detecting the position of redundancy versions.

Reference is now made to FIG. 6 which shows a method for determining the fixed starting positions of RVs. In particular the starting position of RV may be fixed if the criteria in one or more of the steps of FIG. 6 are satisfied.

It should be appreciated that this method may be performed by a network element such as an access point whilst the network is in operation. Alternatively or additionally, the method may be used when configuring a network or during re-configuration of the network.

In step 601, it is determined whether the separation between the starting position of RV2 and RV3 is larger than the separation in-between the starting positions of RV1 and RV2.

In step 603, it is determined whether the separation between the starting position of RV1, RV2, and RV3 to the respective previous RV gradually increases (i.e. the separation of RV3→RV2>RV2→RV1>RV1→RV0).

In step 605, it is determined whether the starting position for RV1, RV2, and/or RV3 are outside the region of system bits 301.

In step 607, it is determined whether the separation between the starting position of RV0 and RV1 is larger than the separation 1) between the starting position of RV1 and RV2, and 2) between the starting position of RV2 and RV3.

An eNB may select the RV based on embodiments provided herein according to an end position of the last transmission for an information block. The eNB may then configure the RV index to UE. A UE may then transmit or receive transmissions based on the RV definition and eNB configuration. Embodiments herein provide that the selected starting positions for RV1, RV2 and RV3 may create a circular buffer which may be similar to a sequential transmission when considering the RV positions of all of the code rates in sequential transmission, providing suitable retransmitted encoded bits in retransmission(s).

Such a definition of the starting position of RVs may also provide a similar effect as dense RV for high-priority bits range.

For example, for fixed RV starting positions, by collecting the starting position of the second transmission (starting position of RV1) for all the possible code rates (for example from 0.33 to 0.94 with a step 0.01) with assumption of sequential transmission (this sequential transmission means each retransmission starts from the end of the last transmission), a cumulative distribution function (CDF) may be produced.

The CDF may be for an entire network. In some embodiments, the CDF may be predefined and included in standard.

Figure 9:
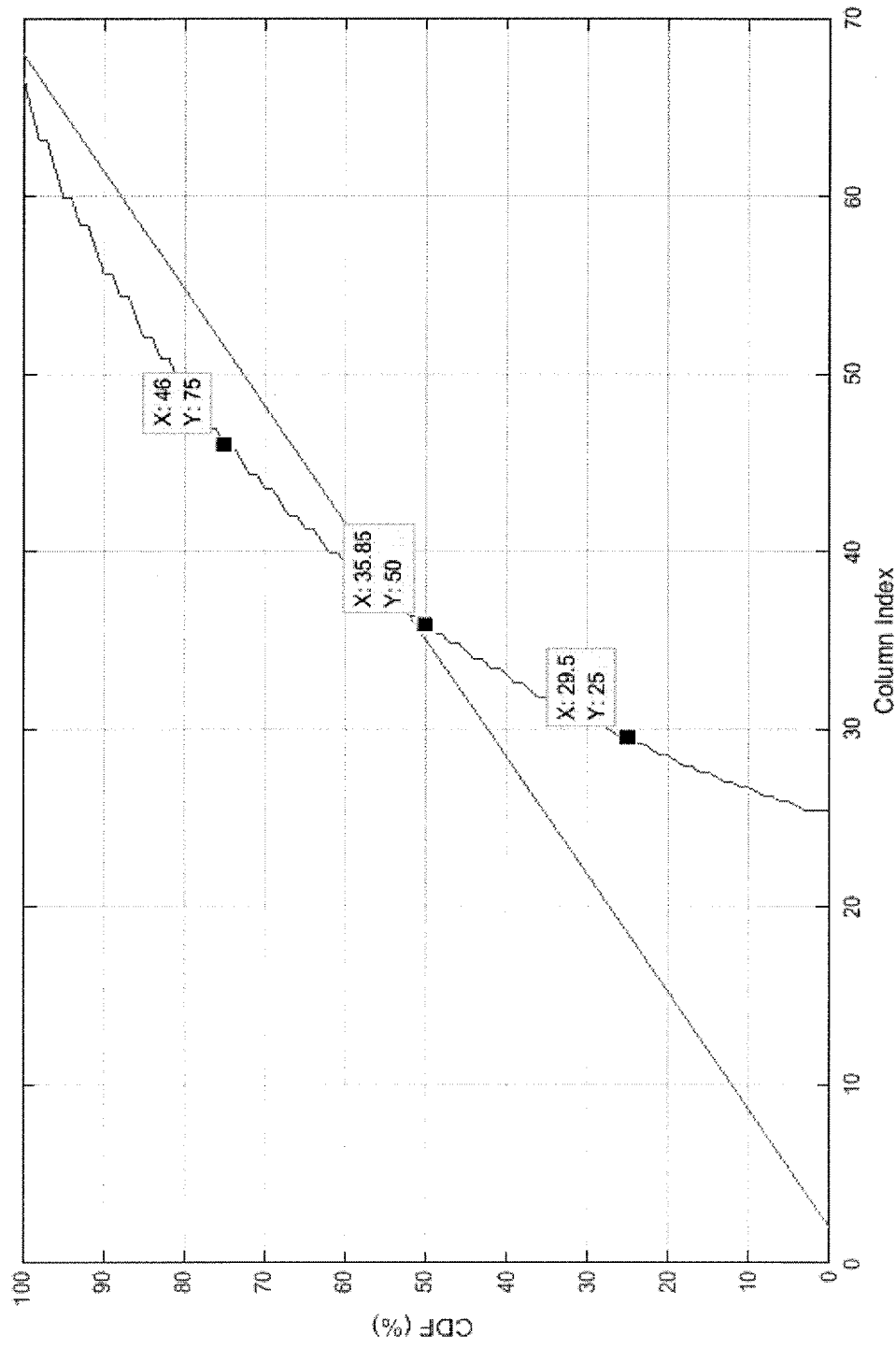
FIG. 9 shows the cumulative distribution function (CDF) for the starting position of the second RV retransmission(s)

FIG. 9 shows the cumulative distribution function (CDF) for the starting position of the second retransmission(s) for all possible code rates against the column index of the starting position of RVs in the circular buffer with an assumed sequential transmission. Selecting points on the CDF at 25%, 50% and 75% for the starting positions of RV1, RV2 and RV3, may produce column index values of 29.5*z, 35.85*z, 46*z, for the starting positions of RV1, RV2, and RV3 respectively. These values are by way of example only and are based on one example.

These values represent the column index of starting position of the RVs in the circular buffer. For example, the size of circular buffer may be 68*z, where z is the lifting size for Quasi-Cyclic LDPC. A different size of circular buffer may be used in different embodiments. A column index of the starting position is defined as a number multiplied by z.

Thus, for one transmission of one specific code rate (i.e. RV0), the nearest position (e.g. RV1) and/or the nearest but later position for retransmission will be selected from {RV1, RV2, RV3} to provide a similar effect as the sequential transmission. Sequential transmission means each retransmission starts from the end of the last transmission. In some embodiments, there will be only 4 fixed starting positions predefined for RVs. Based on this method, for each code rate, the starting position of retransmission can be selected from the predefined fixed starting position of RVs. Although not the same as sequential transmission, but considering all possible code rates, the distance to the position for sequential transmission will be smaller than for uniformly spaced RVs.

It can be seen that in this example and the following two examples, the starting position of RVs satisfy the following criteria:
 a separation provided between the starting position of a third redundancy version RV2 and the starting position of a fourth redundancy version RV3 is larger than the separation between the starting position of
 a second redundancy version RV1 and the starting position of the third redundancy version RV2;
 a starting position of the second redundancy version RV1, third redundancy version RV2, and/or fourth redundancy version RV3 being outside a region of system bits; and
 a separation between the starting position of the first redundancy version RV0 and the starting position of second redundancy version RV1 is larger than a separation between the starting position of the second redundancy version RV1 and the starting position of a third redundancy version RV2, and a separation between the starting position of the third redundancy version RV2 and the starting position of a fourth redundancy version RV3.

Figure 10:
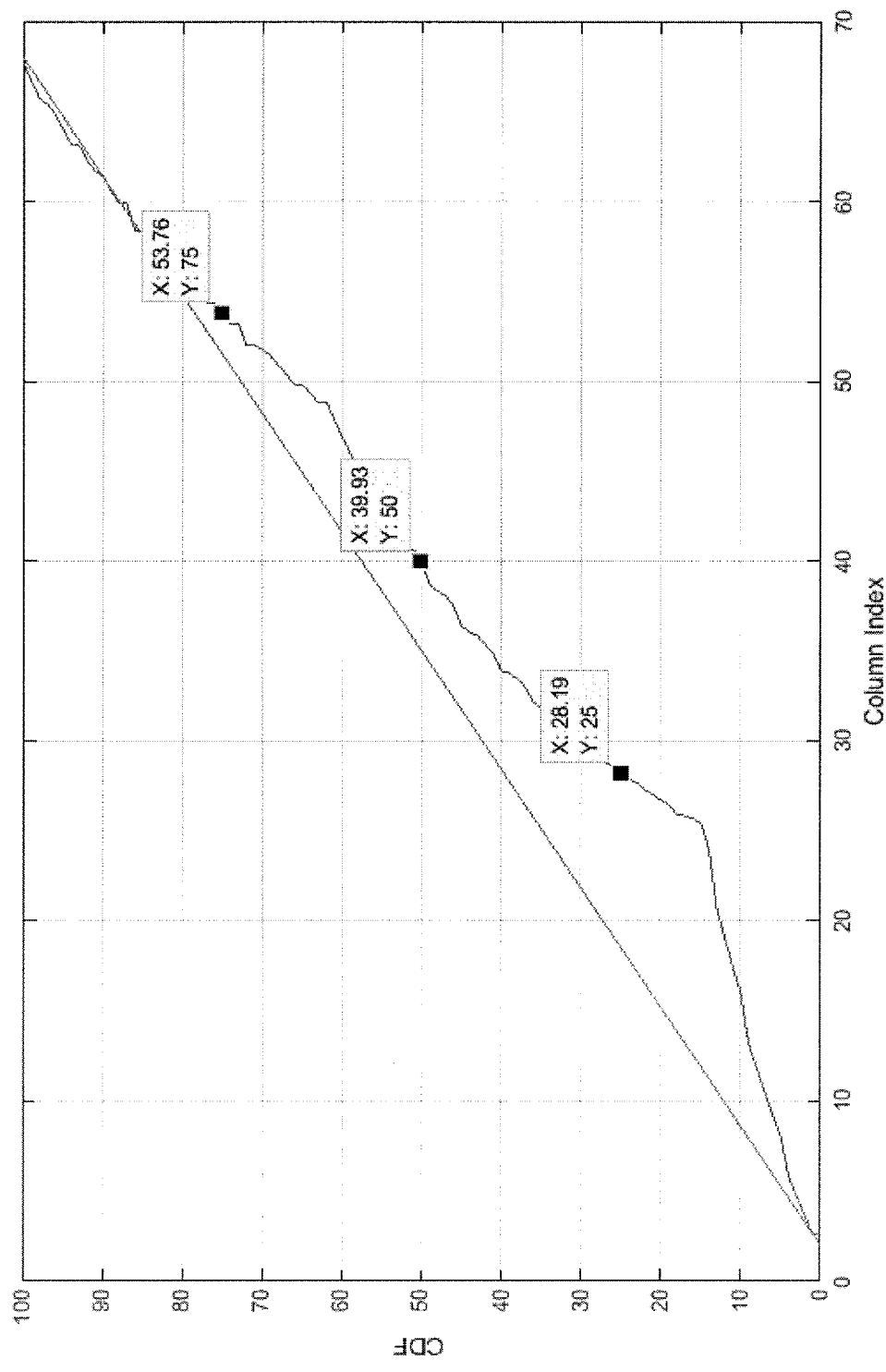
FIG. 10 shows the cumulative distribution function (CDF) for the starting position of the second, and third RV retransmission(s)

In another similar example for fixed RV positions, by collecting the starting position of the second and third transmissions for all the possible code rates with the assumption of sequential transmission, and assuming the same resource size for each transmission of information block, a cumulative distribution function (CDF) may be produced. Again, selecting points on the CDF at 25%, 50% and 75% for starting position of RV1, RV2 and RV3, may produce column index values for starting position of RV1, RV2 and RV3 of 28.19*z, 39.93*z, 53.76*z respectively. FIG. 10 shows the cumulative distribution function (CDF) for the starting position of the second, and third retransmission(s) for all possible code rates against the column index of the starting position of RVs in the circular buffer with an assumed sequential transmission.

In a final similar example for fixed RV positions, based on the starting position of second, third, and fourth transmissions of all the possible code rates with assumption of sequential transmission, and assuming the same resource size for each transmission of the information block, a cumulative distribution function (CDF) may be produced. Again, selecting points on the CDF at 25%, 50% and 75% for the starting position of RV1, RV2 and RV3, may produce column index values for the starting positions of RV1, RV2 and RV3 of 24*z, 35.85*z, 51.79*z respectively.

In some embodiments, the definition of the starting positions for RVs may be per base graph and/or per type of base graph. Herein, multiple base graphs or multiple types of base graph may support different minimum code rates. Thus, starting positions for RVs per base graph or per type of base graph may be defined based on the supported minimum code rate of the base graph. For example, 5G may utilize 2 base graphs for LDPC, for example, the first base graph may be used for the initial transmission and subsequent re-transmissions of the same TB when the code block size (CBS)>X or code rate of the initial transmission>Y, and the second base graph may be used for the initial transmission and subsequent re-transmissions of the same TB when the code block size (CBS)<=X and code rate of the initial transmission<=Y, for example where X=2560 and Y=0.67.

Figure 11:
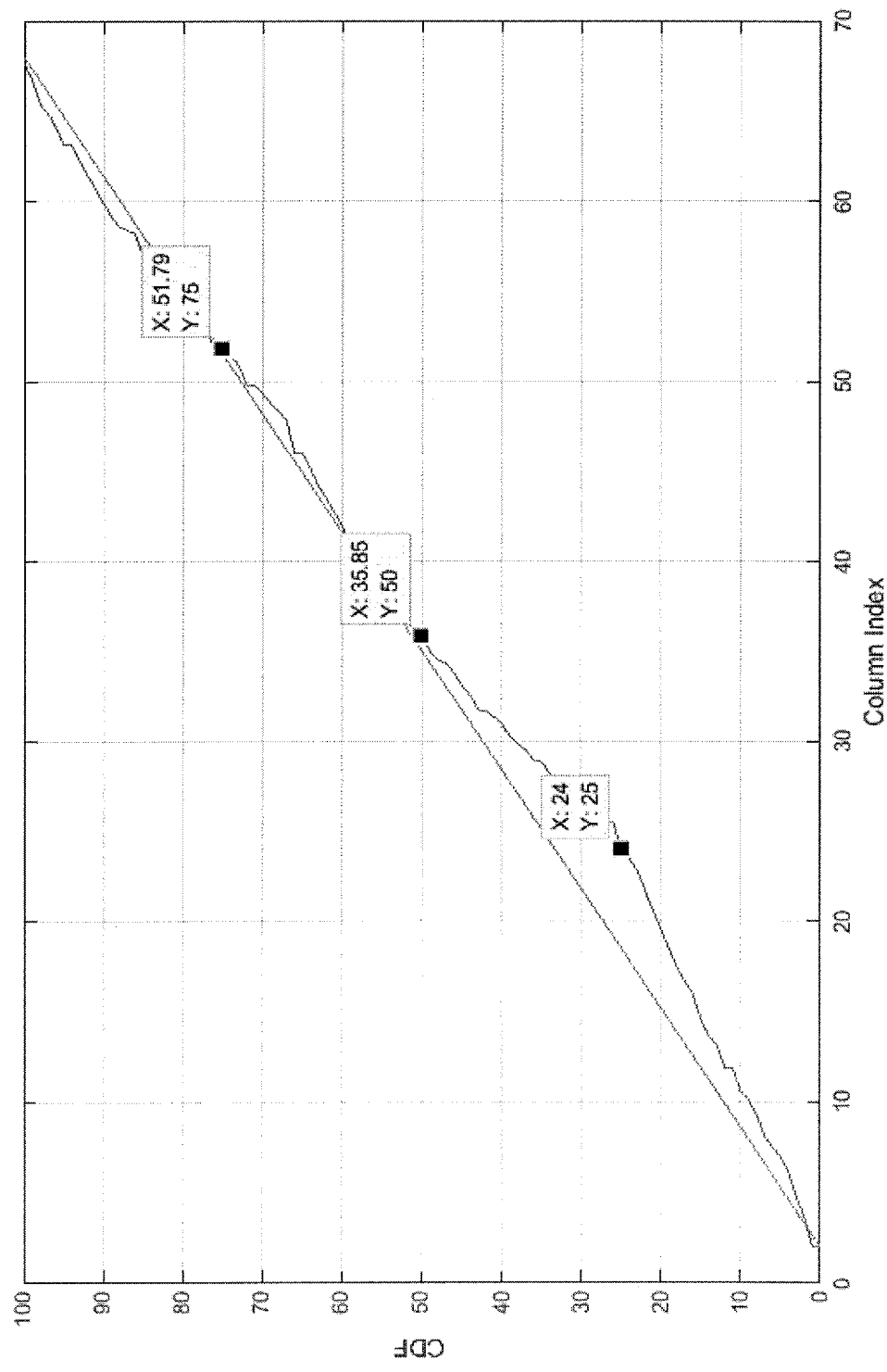
FIG. 11 shows the cumulative distribution function (CDF) for the starting position of the second, third, and fourth RV retransmission(s).

FIG. 11 shows the cumulative distribution function (CDF) for the starting position of the second, third, and fourth retransmission(s) for all possible code rates against the column index of the starting position of RVs in the circular buffer with an assumed sequential transmission.

In some embodiments, the starting position of the RVs are fixed. In some embodiments, the base station will configure the RV index in control information which is provided to the UE. The UE will then know the starting position for the retransmission according to the fixed starting position of the configured RV index. The UE may transmit or receive based on the RV definition and the base station configuration.

Some embodiments may use a similar procedure to that proposed for LTE.

The UE and the base station may use the same fixed starting positions for the RVs. In other embodiments, the UE and the base station may use different fixed starting positions for the RVs.

In some embodiments, the UE identifies the starting position of the encoded bits from the circular buffer according to an RV and then transmits to or receives from eNB the encoded bits according to the RV.

The base station may configure the UE as to which criteria the RV satisfy. The base station may configure parameters of the criteria or parameters to generate the criteria.

The parameters of the criteria may be, for example, one or more of the code rates that is used to generate the starting position of the RVs by assuming sequential transmission, number of retransmission that is used to generate the starting position of the RVs by assuming sequential transmission.

These parameters may be found in the example CDFs described previously, with a different code rate set and/or number of retransmission that are used to generate the starting position of RVs which may generate different starting positions.

Figure 8:
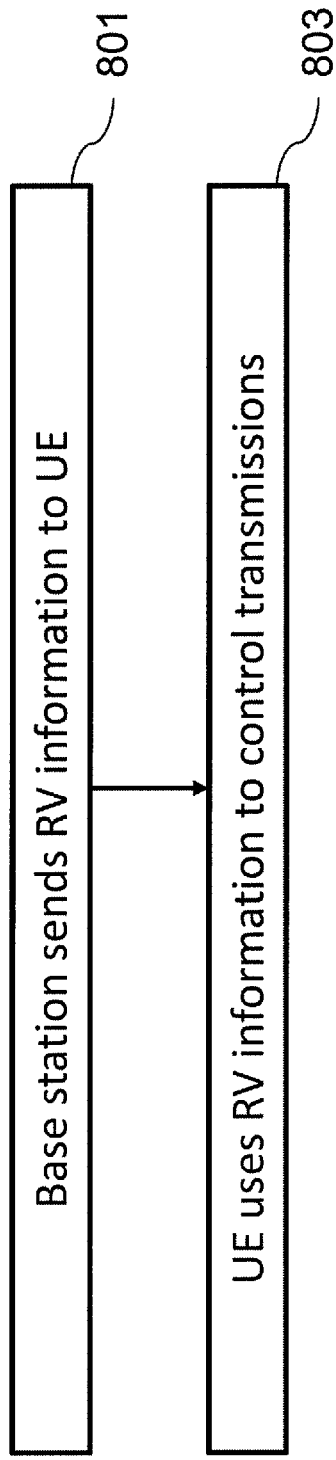
FIG. 8 shows a method of transmission of RV information from the base station to the UE.

FIG. 8 shows a method of transmission of RV information from the base station to the UE. In step 801, the base station sends RV information to the UE. In step 803, the UE then uses the RV information which it received in step 801 to control the transmissions. This RV information may be the RV index.

In some embodiments, a different number of RVs may be provided than the four provided in the previous examples.

It has been proposed that the RVs are at always at the same fixed locations in the circular buffer. In other embodiments, the locations may be varied dependent on one or more factors. For example, the locations may be dependent on channel conditions.

In some embodiments, the fixed locations are the same for all code rates. However, in other embodiments, the fixed locations may be dependent on the code rate.

In some embodiments, the fixed locations may be the same for the UE and the base station. In other embodiments, the fixed locations may be different for the UE and the base station.

In some embodiments, the number of fixed locations may be the same for the UE and the base station. In other embodiments, the number of fixed locations may be different for the UE and the base station.

In some embodiments, a single set of RV positions may be defined for all code rates. In other embodiments, a plurality of different sets of RV positions may be defined. In some embodiments, at least one or more of the sets of RV positions may satisfy one or more of the previously described criteria. In some embodiments, all of the sets of RV positions may satisfy one or more of the previously defined criteria.

Embodiments have been described in the context of LPDC coding. It should be appreciated that other embodiments may be used with any other suitable block code.

It is noted that the above discussed issues are not limited to any particular communication environment, but may occur in any appropriate communication system.

The required data processing apparatus and functions may be provided by means of one or more data processors. The described functions may be provided by separate processors or by an integrated processor. The data processors may be of any type suitable to the local technical environment, and may include one or more of general purpose computers, special purpose computers, microprocessors, digital signal processors (DSPs), application specific integrated circuits (ASIC), gate level circuits and processors based on multi core processor architecture, as non-limiting examples. The data processing may be distributed across several data processing modules. A data processor may be provided by means of, for example, at least one chip. Appropriate memory capacity can be provided in the relevant devices. The memory or memories may be of any type suitable to the local technical environment and may be implemented using any suitable data storage technology, such as semiconductor based memory devices, magnetic memory devices and systems, optical memory devices and systems, fixed memory and removable memory. One or more of the steps discussed in relation to FIG. 8 may be performed by one or more processors in conjunction with one or more memories.

An appropriately adapted computer program code product or products may be used for implementing the embodiments, when loaded or otherwise provided on an appropriate data processing apparatus. The program code product for providing the operation may be stored on, provided and embodied by means of an appropriate carrier medium. An appropriate computer program can be embodied on a computer readable record medium. A possibility is to download the program code product via a data network. In general, the various embodiments may be implemented in hardware or special purpose circuits, software, logic or any combination thereof. Embodiments of the inventions may thus be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

It is noted that whilst embodiments have been described in relation to certain architectures, similar principles can be applied to other systems. Therefore, although certain embodiments were described above by way of example with reference to certain exemplifying architectures for wireless networks, technologies and standards, embodiments may be applied to any other suitable forms of communication systems than those illustrated and described herein. It is also noted that different combinations of different embodiments are possible. It is also noted herein that while the above describes exemplifying embodiments of the invention, there are several variations and modifications which may be made to the disclosed solution without departing from the spirit and scope of the present invention.

What is claimed is:

1. A method comprising:
   receiving, from a base station, redundancy version information for a data unit; and
   using, based on the received redundancy version information, at least one redundancy version from a set of redundancy versions for transmission of the data unit to the base station, wherein the set of redundancy versions comprises redundancy versions RV0, RV1, RV2 and RV3, wherein starting positions of said redundancy versions in a buffer used in block coding of the data unit satisfy at least the following criteria:

a separation provided between a starting position of RV2 and a starting position of RV3 is larger than a separation between a starting position of a RV1 and the starting position of RV2;

a separation provided between the starting position of RV1, the starting position of RV2, or the starting position of RV3 and the starting position of a respective previous consecutive redundancy version is increased;

the starting position of RV1, RV2, and/or RV3 is outside a region of system bits of said buffer; and a separation between the starting position of RV0 and the starting position of RV1 is larger than the separation between the starting position of RV1 and the starting position of RV2, and the separation between the starting position of RV2 and the starting position of RV3.

2. A method as claimed in claim 1, comprising determining a starting position of encoded bits from a buffer according to a respective one of said redundancy versions.

3. A method as claimed in claim 2, comprising one of receiving and causing transmission of the encoded bits according to the respective one of said redundancy versions.

4. A method as claimed in claim 1, wherein the respective starting position of the redundancy versions in the redundancy version set are fixed.

5. A method as claimed in claim 4, wherein the redundancy version set has four redundancy versions.

6. A method as claimed in claim 1, wherein said buffer is a circular buffer.

7. A method as claimed in claim 1, comprising receiving redundancy version index information and in dependence on said redundancy version index information, using the respective redundancy version.

8. A method as claimed in claim 1, comprising receiving configuration information to define a criteria which the respective redundancy versions satisfy.

9. A method as claimed in claim 1, wherein the configuration information comprises at least one of:

code rates to generate the starting positions of redundancy versions; and number of retransmission to generate the starting positions of redundancy versions.

10. A method as claimed in claim 1, wherein said buffer comprises a first region comprising system bits to be transmitted and a second region comprising parity bits to be transmitted.

11. A method as claimed in claim 10, wherein said first, second, and third redundancy versions are provided in said first region.

12. A method as claimed in claim 10, wherein said fourth redundancy version is provided in the second region.

13. A method as claimed in claim 10, wherein said second, third and fourth redundancy versions are provided in said second region.

14. A method as claimed in claim 10, wherein said first redundancy version is provided in the first region.

15. A method as claimed in claim 1, wherein said fixed redundancy positions are selected based on a starting position of at least a second transmission with sequential transmission method.

16. A method as claimed in claim 1, wherein said block coding comprises low density parity check coding.

17. An apparatus, said apparatus comprising at least one processor, and at least one memory including computer program code, wherein the at least one memory and the computer program code are configured, with the at least one processor, to:

receive, from a base station, redundancy version information for a data unit; and use, based on the received redundancy version information, at least one redundancy version from a set of redundancy versions for transmission of the data unit to the base station, wherein the set of redundancy versions comprises redundancy versions RV0, RV1, RV2 and RV3, wherein starting positions of said redundancy versions in a buffer used in block coding of the data unit satisfy one or more of the following criteria:

a separation provided between a starting position of RV2 and a starting position of a RV3 is larger than a separation between a starting position of RV1 and the starting position of RV2;

a separation provided between the starting position of RV1, the starting position of RV2, or the starting position of RV3 and the starting position of a respective previous consecutive redundancy version is increased;

the starting position of RV1, RV2, and/or RV3 is outside a region of system bits of said buffer; and a separation between the starting position of RV0 and the starting position of RV1 is larger than the separation between the starting position of RV1 and the starting position of RV2, and the separation between the starting position of RV2 and the starting position of a RV3.

* * * * *

UNITED STATES PATENT AND TRADEMARK OFFICE
CERTIFICATE OF CORRECTION

PATENT NO. : 11,044,047 B2  
APPLICATION NO. : 16/637789  
DATED : June 22, 2021  
INVENTOR(S) : Sun et al.

Page 1 of 1

It is certified that error appears in the above-identified patent and that said Letters Patent is hereby corrected as shown below:

In the Claims

Column 18,
Line 34, "starting position of a RV3" should read --starting position of RV3--;
Line 47, "starting position of a RV3" should read --starting position of version RV3--.

Signed and Sealed this
Fourteenth Day of June, 2022

Katherine Kelly Vidal
*Director of the United States Patent and Trademark Office*